US007330385B2

(12) United States Patent
Gerber (10) Patent No.: US 7,330,385 B2
(45) Date of Patent: Feb. 12, 2008

(54) INTEGRATED SEMICONDUCTOR MEMORY DEVICE WITH ADAPTATION OF THE EVALUATION CHARACTERISTIC OF SENSE AMPLIFIERS

(75) Inventor: Ralf Gerber, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 134 days.

(21) Appl. No.: 11/324,779

(22) Filed: Jan. 4, 2006

(65) Prior Publication Data
US 2006/0152986 A1 Jul. 13, 2006

(30) Foreign Application Priority Data
Jan. 5, 2005 (DE) .................... 10 2005 000 841

(51) Int. Cl.
*G11C 29/00* (2006.01)
(52) U.S. Cl. ....................................... 365/201; 365/207
(58) Field of Classification Search ................ 365/201, 365/207, 203
See application file for complete search history.

(56) References Cited
U.S. PATENT DOCUMENTS
5,305,261 A * 4/1994 Furutani et al. ........ 365/189.01

| | | |
|---|---|---|
| 6,424,142 B1 | 7/2002 | Kato et al. |
| 6,707,738 B2 | 3/2004 | Choi et al. |
| 6,930,938 B2 * | 8/2005 | Yasuda ........................ 365/201 |

OTHER PUBLICATIONS

Jung-Won, Suh, et al., "Offset-Trimming Bit-Line Sensing Scheme for Gigabit-Scale DRAMs", *IEEE Journal of Solid-State Circuits*, Bd. 31 Nr. 7, Jul. 1996, pp. 1025-1028.

* cited by examiner

*Primary Examiner*—Anh Phung
(74) *Attorney, Agent, or Firm*—Edell, Shapiro & Finnan, LLC (57) ABSTRACT

An integrated semiconductor memory device includes memory cells which are connected to first sense amplifiers or second sense amplifiers via in each case one bit line pair. During a read access of one of the memory cells, the sense amplifier connected to the memory cell to be read out evaluates a cell voltage of the memory cell to be read out and generates a data item with a logical Low or High level depending on the level of the cell voltage at a data terminal. However, if the sense amplifiers are not of identical construction or arrangement, the same cell voltage level is evaluated differently by the first sense amplifier than by the sense amplifier. To match the evaluation performance of the first and second sense amplifiers, the connected bit line pairs are precharged to different precharging voltages before a read access.

13 Claims, 4 Drawing Sheets

FIG 6

INTEGRATED SEMICONDUCTOR MEMORY DEVICE WITH ADAPTATION OF THE EVALUATION CHARACTERISTIC OF SENSE AMPLIFIERS

CROSS REFERENCE TO RELATED APPLICATIONS

This application claims priority under 35 USC §119 to German Application No. DE 10 2005 000 841.0, filed on Jan. 5, 2005, and titled "Integrated semiconductor memory device with Adaptation of the Evaluation Performance of Sense Amplifiers" which is hereby incorporated by reference.

FIELD OF THE INVENTION

The present invention relates to an integrated semiconductor memory device with a first and second sense amplifier type for evaluating a cell signal of a memory cell.

BACKGROUND

Figure 1:
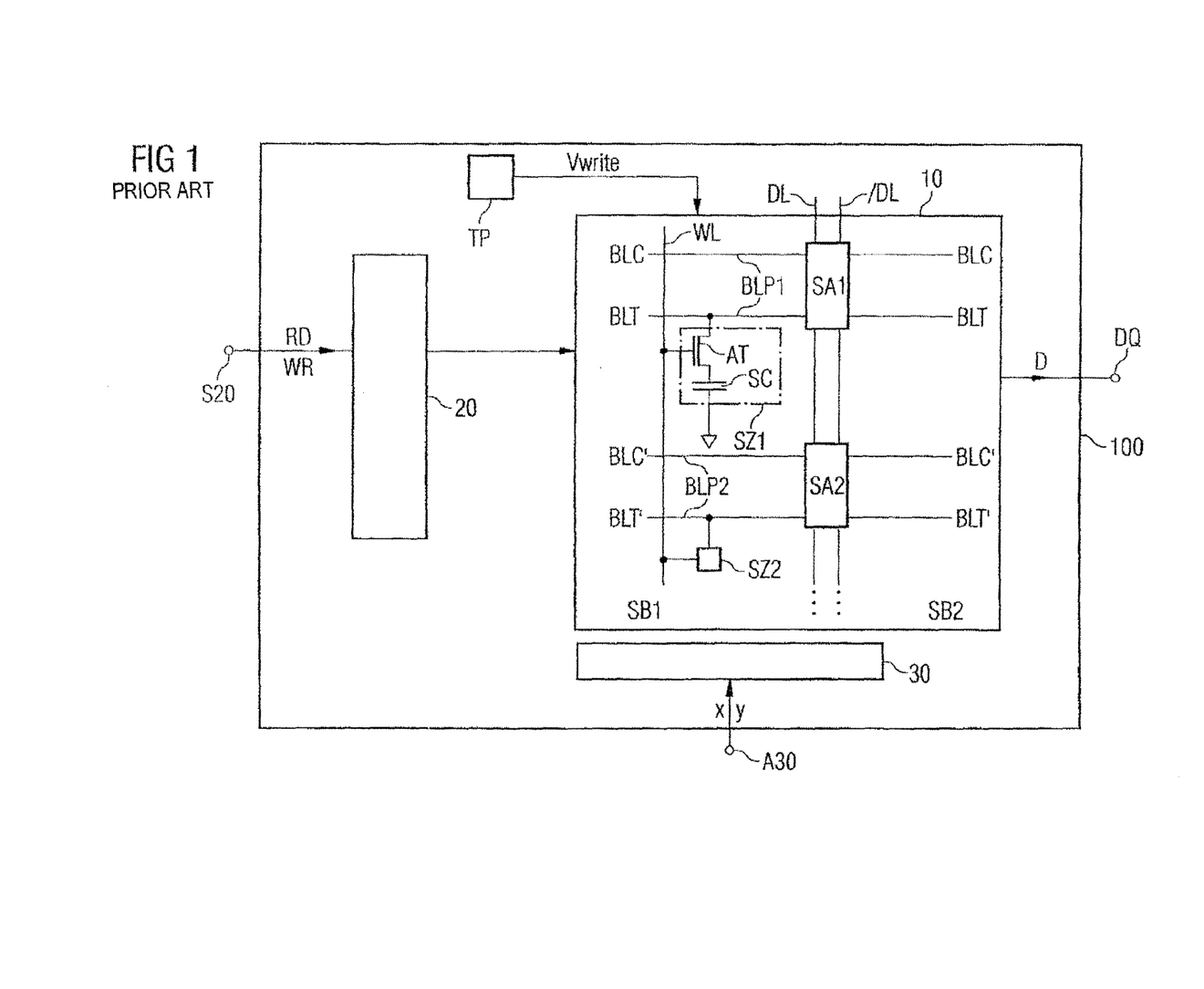
FIG. 1 depicts an integrated semiconductor memory device with a first and second sense amplifier.

FIG. 1 shows an integrated semiconductor memory device 100 with a memory cell array 10 in which memory cells are arranged in the form of a matrix along the word and bit lines. The memory cell array includes a first sense amplifier SA1 which is connected on both sides to bit lines of a bit line pair BLP1. The bit line pair BLP1 includes a true bit line BLT and a complement bit line BLC. A DRAM (dynamic random access memory) memory cell SZ1 is connected to the true bit line BLT. The memory cell SZ1 includes a storage capacitor SC which is connected to the true bit line BLT via a selection transistor AT. The selection transistor AT can be controlled to conduct by a control signal on the word line WL so that the storage capacitor SC is conductively connected to the true bit line BLT.

Apart from the first sense amplifier, the memory cell array 10 includes a second sense amplifier SA2 which is connected on both sides to a bit line pair BLP2. The bit line pair BLP2 includes a true bit line BLT' and a complement bit line BLC'. A memory cell SZ2 which is also controlled by a control signal on the word line WL is connected to the true bit line BLT'.

To control a read or write access of one of the memory cells of the memory cell array 10, a control circuit 20 is provided. The control circuit 20 includes a control terminal S20 for applying control signals. A write or read access takes place depending on the applied control signals WR or RD. The integrated semiconductor memory device also includes an address register 30 having an address terminal A30. One of the memory cells of the memory cell array 10 can be selected for the read or write access by applying an address signal which includes an address part X and an address part Y. During this process, the address part X selects a word line whereas the address part Y selects one of the bit line pairs. As a result, it is possible to select the memory cell which is located at the point of intersection of the selected word line with the selected bit line pair.

When an information item is written into the memory cell SZ1, the address of the memory cell SZ1 is applied to the address terminal A30. After that, a write command WR is applied to the control terminal S20 and a data item D with a logical Low or High level is applied to the data terminal DQ. In the case of a logical High level, the sense amplifier SA1 feeds a high voltage potential VBH to the true bit line BLT and a low voltage potential VBL to the complement bit line. In the case of a logical Low level, the sense amplifier SA1 feeds in the low voltage potential VBL on the true bit line BLT and the high voltage potential VBH on the complement bit line BLC. The word line is driven by the control circuit 20 in such a manner that the selection transistor AT is switched into the conducting state. Thus, a first memory state with a high level of a cell voltage or a second memory state with a low level of the cell voltage can be stored in the storage capacitor SC in accordance with the high or low voltage potential on the bit line BLT.

Before and after a read and write access, the bit lines BLT and BLC are charged up to a level of a precharging voltage VEQ during a precharging process. The level of precharging voltage is between the level of the high voltage potential VBH and the level of the low voltage potential VBL.

When the memory state or, respectively, the cell voltage of the memory cell SZ1 is read out, a corresponding address signal for selecting the memory cell SZ1 is applied to the address terminal A30. A read command RD is applied to the control terminal S20 of the control circuit 20. As a result, the word line WL is driven with a high level of a control voltage so that the selection transistor AT of the memory cell SZ1 is controlled to conduct. When a high level of the cell voltage has been stored in the memory cell SZ1, an increase in potential is produced on the true bit line BLT with respect to the precharging voltage VEQ. If, in contrast, a low level of the cell voltage has been stored in the memory cell SZ1, a decrease in potential compared with the precharging voltage VEQ is produced on the true bit line BLT. The complement bit line BLC, in contrast, remains at the level of the precharging voltage VEQ to which it has been charged up after the write access.

The first sense amplifier SA1 evaluates the potential difference between the true bit line BLT and the complement bit line BLC and generates a Low and High level complementary to one another on the data lines DL and /DL. The two complementary levels are again amplified by a secondary sense amplifier, not shown in FIG. 1, so that the data item D is output with a logical Low or High level to the data terminal DQ.

When the level of the cell voltage of the memory cell to be read out is above a level of a threshold voltage of the sense amplifier, the data item D is generated with the logical High level at the data terminal DQ. If, in contrast, the level of the cell voltage of the memory cell to be read out is below a level of the threshold voltage of the sense amplifier, the data item D is generated with the logical Low level at the data terminal DQ.

Figure 2:
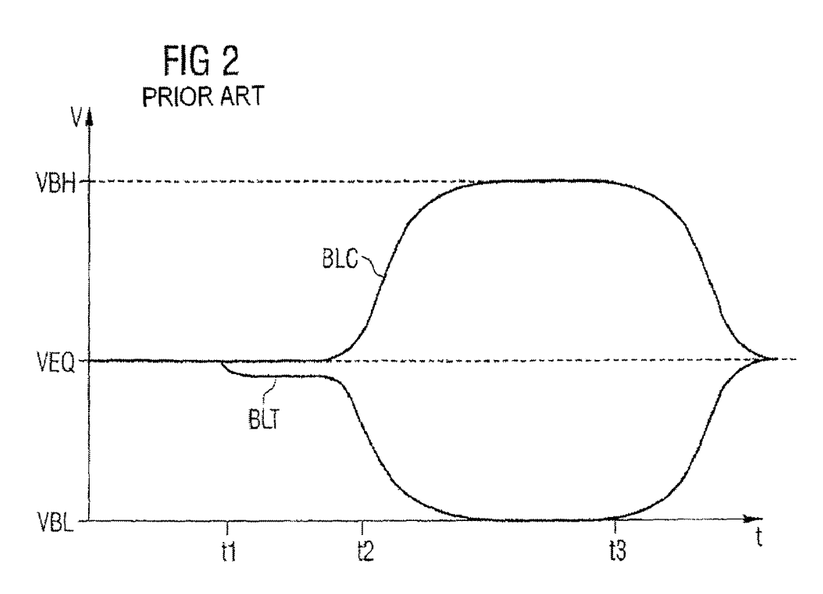
FIG. 2 is a plot of voltage variations on a bit line pair during an evaluation process of a cell voltage by a sense amplifier.

FIG. 2 shows potential variations on a true and complement bit line during the reading-out of a memory cell, the storage capacitor of which is charged up to a low cell voltage. Before the actual reading process, the two bit lines are charged up to the precharging voltage DQ. At time t1, a control voltage is fed in by the control circuit 20 on the word line connected to the memory cell to be read out. As a result, all memory cells along the word line are activated by their selection transistors being controlled to conduct. Due to the low cell voltage in the example of FIG. 2, a decrease in potential compared with the level of the precharging voltage VEQ occurs on the true bit line BLT. The complement bit line BLC is still charged to the level of the precharging voltage originating from the precharging process.

At time t2, the different potential states on the true bit line BLT and the complement bit line BLC are evaluated by the connected sense amplifier. Since the voltage level on the true bit line BLT is below the level of the precharging voltage on the complement bit line, a decrease in potential to the voltage potential VBL, which, for example, corresponds to a voltage of 0 volts, occurs on the true bit line BLT. In consequence of the evaluation process by the sense amplifier, an increase in potential to the high voltage potential VBH, for example to a voltage of 1.2 volts, occurs on the complement bit line BLC.

The sense amplifier forwards the low voltage level VBL of the true bit line BLT to the data line DL. The high voltage level VBH of the complement bit line BLC is forwarded to the complementary data line /DL. The high and low voltage level are supplied via the two data lines to the secondary sense amplifier which ultimately generates at the data terminal DQ a data item with a logical Low level which corresponds to the memory state in the memory cell.

The evaluation characteristic of a sense amplifier, illustrated in FIG. 2, is dependent on various factors. For example, the magnitude of the increase in potential or decrease in potential on the bit line is dependent on the length of the bit lines and thus on the bit line resistance and bit line capacity. For example, the same cell voltage leads to different increases or decreases in potential compared to the level of the precharging voltage on different bit lines. Furthermore, the layout of the sense amplifier connected to a bit line pair is of decisive significance. Within a memory cell array, the sense amplifiers differ, for example, due to different implants, due to different doping profiles and due to the proximity and orientation with respect to substrate wells of adjacent components. The sense amplifiers of a memory cell array therefore have different electrical characteristics which leads to different evaluation performance with respect to the cell voltage during a read process. The level of the threshold voltage at which a sense amplifier evaluates a cell voltage potential with a logical Low or High level at the data terminal is thus dependent, on the one hand, on the layout of the sense amplifier and, on the other hand, on influences of the circuit environment.

Figure 3:
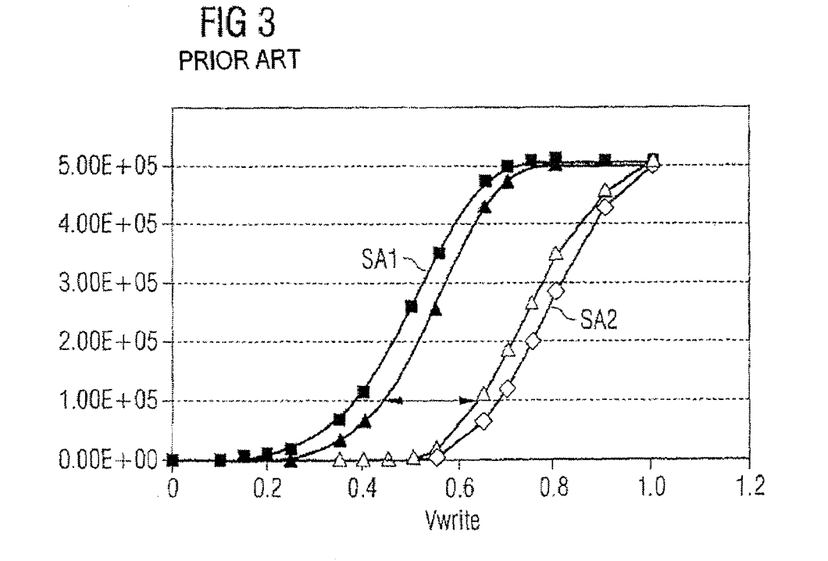
FIG. 3 is a plot showing failures of memory cells during the evaluation of different cell voltages of the memory cells.

FIG. 3 shows the performance of first sense amplifiers SA1 and second sense amplifiers SA2 of a memory cell array which differ from one another in their layout, during the evaluation of various cell voltages Vwrite. For example, different cell voltage levels are stored in the memory cells in that various voltage levels between 0 and 1.2 volts are applied to a contact pad TP which, for example, is accessible to an external test device at wafer level. The number of memory cells which have been evaluated with a logical High level instead of with a logical Low level during the reading-out by the connected sense amplifiers is plotted.

In the first test step, a particular voltage level, for example 0 volts, is applied to the contact pad TP and fed in on the connected bit lines via the sense amplifiers. After the activation of the memory cells, a low cell voltage is stored in them. During a subsequent read process, the stored cell voltage is evaluated again by the sense amplifiers and the corresponding logical Low or High level is generated at the data terminal DQ. A test device detects the occurrence of the logical Low level at the data terminal DQ.

During the evaluation of a cell voltage of 0 volts, the memory state in almost all memory cells is evaluated correctly by the first sense amplifiers SA1. Thus, not many memory cells fail. In the test steps then following, the cell content is evaluated by the first sense amplifiers, a higher cell voltage being stored in the memory cells during each test step. Above a cell voltage of approx. 0.4 volts, the memory content of approximately $1 \times 10^5$ memory cells is evaluated with the logical High level at the data terminal DQ by the first sense amplifiers. The more the cell voltage is rising in the subsequent test steps, the more memory cells are evaluated with the logical High level by the first sense amplifiers SA1. Above a cell voltage of 0.6 volts, the first sense amplifiers generate a data item with the logical High level at the data terminal G2 during the reading-out of almost all memory cells.

The second sense amplifiers SA2 generate the logical Low level at the data terminal DQ for almost all of the memory cells connected to them up to a cell voltage of approx. 0.6 volts. The higher the cell voltage is above 0.6 volts, the more memory cells are evaluated with the logical High level by the second sense amplifiers. Above a cell voltage of approximately 1 volt, the second sense amplifiers generate the logical High level at the data terminal DQ during the reading-out of almost all memory cells connected to them.

The two curves of FIG. 3 showing the evaluation performance of the first and second sense amplifiers deviate from one another. Depending on whether they belong to a first type of sense amplifier or to a second type of sense amplifier, the sense amplifiers exhibit a different evaluation performance of cell voltages.

SUMMARY

It is the object of the present invention to provide an integrated semiconductor memory device in which differences in the evaluation performance of various types of sense amplifier of a memory cell array are reduced.

It is another object of the present invention to provide a method by which differences in the evaluation performance of different types of sense amplifier of a memory cell array are reduced.

The aforesaid objects are achieved individually and/or in combination, and it is not intended that the present invention be construed as requiring two or more of the objects to be combined unless expressly required by the claims attached hereto.

In accordance with the present invention, an integrated semiconductor memory device with adaptation of the evaluation performance of sense amplifiers comprises an output terminal to output a data item, memory cells which in each case exhibit a cell voltage depending on a memory state, bit line pairs which in each case comprise a first bit line and a second bit line, and sense amplifiers which in each case evaluate the cell voltage of one of the memory cells. First ones of the memory cells are connected to a first one of the sense amplifiers via one of the bit lines of a first one of the bit line pairs. Second ones of the memory cells are connected to a second one of the sense amplifiers via one of the bit lines of a second one of the bit line pairs. The first one of the sense amplifiers is constructed in such a manner that it evaluates the cell voltage of the one of the first ones of the memory cells during a read access to one of the first ones of the memory cells. Depending on the evaluation of the cell voltage, the data item is generated with a first level at the output terminal when the cell voltage of the one of the first ones of the memory cells is above a first threshold voltage, and the data item is generated at the output terminal with a second level if the cell voltage of the one of the first ones of the memory cells is below the first threshold voltage. The second one of the sense amplifiers is constructed in such a manner that it evaluates the cell voltage of the one of the second ones of the memory cells during a read access of one of the second ones of the memory cells. Depending on the evaluation of the cell voltage, the data item is generated with the first level at the output terminal when the cell voltage of the one of the second ones of the memory cells is above a second threshold voltage, and the date item is generated with the second level at the output terminal when the level of the cell voltage of the one of the second memory cells is below the second threshold voltage, a level of the second threshold voltage differing from a level of the first threshold voltage. The integrated semiconductor memory device also comprises a first controllable voltage generator to generate a first precharging voltage and a second controllable voltage generator to generate a second precharging voltage, a level of the first precharging voltage differing from a level of the second precharging voltage. The first precharging voltage can be supplied to the bit lines of the first one of the bit line pairs. The second precharging voltage can be supplied to the bit lines of the second one of the bit line pairs.

The circuit enables the evaluation performance of the first and second ones of the sense amplifiers, which, for example, originates from differences in layout of the two sense amplifiers, to be matched to one another.

According to an embodiment of the integrated semiconductor memory device of the invention, the first one of the sense amplifiers is constructed in such a manner that it generates a high voltage potential on the first one of the bit lines of the first one of the bit line pairs during a write and read access of one of the first ones of the memory cells and a low voltage potential on the second one of the bit lines of the first one of the bit line pairs. The second one of the sense amplifiers is constructed in such a manner that it generates the high voltage potential on the first one of the bit lines of the second one of the bit line pairs and the low voltage potential on the second one of the bit lines of the second one of the bit line pairs during a write and read access to one of the second ones of the memory cells. In addition, the first controllable voltage generator is constructed in such a manner that it generates at its output the first precharging voltage with a level which is between the high voltage potential and the low voltage potential. The second controllable voltage generator is constructed in such a manner that it generates at its output the second precharging voltage with a level which is between the high voltage potential and the low voltage potential.

A method for operating an integrated semiconductor memory device in accordance with the invention comprises providing an integrated semiconductor memory device with a first sense amplifier and a second sense amplifier, the first sense amplifier being connected to a first bit line pair including a first and second bit line and first memory cells being connected to the first or second bit line of the first bit line pair, the second sense amplifier being connected to a second bit line pair including a first and second bit line and second memory cells being connected to the first or second bit line of the second bit line pair, and a memory state with a cell voltage being in each case storable in the memory cells. The first sense amplifier is constructed in such a manner that it evaluates the cell voltage of the one of the first memory cells during a read access of one of the first memory cells. A data item is generated at a first level at an output terminal depending on the evaluation of the cell voltage when the cell voltage of the one of the first memory cells is above a first threshold voltage, and the data item is generated with a second level at the output terminal when the cell voltage of the one of the first memory cells is below the first threshold voltage. The second sense amplifier is constructed in such a manner that it evaluates the cell voltage of the one of the second memory cells during a read access of one of the second memory cells. The data item is generated with the first level at the output terminal depending on the evaluation of the cell voltage when the cell voltage of the one of the second memory cells is above a second threshold voltage, and the data item is generated with the second level at the output terminal when the level of the cell voltage of the one of the second memory cells is below the second threshold voltage, where a level of the second threshold voltage differs from a level of the first threshold voltage and the first and second bit lines of the first bit line pair are charged up to a first precharging voltage during a precharging process and the first and second bit lines of the second bit line pair are charged up to a second precharging voltage.

The performance of the first sense amplifier is analyzed by repeatedly performing the following three steps: in a first step, a level of the cell voltage is in each case stored in each of the first memory cells. In a subsequent second step, read accesses of each of the first memory cells occur. In a subsequent third step, the number of data items generated with the first level at the output terminal during the performance of the read accesses is determined depending on the cell voltage of the first memory cells.

After that, the performance of the second sense amplifier is analyzed by repeatedly performing the following three steps: in a first step, a level of the cell voltage is in each case stored in each of the second memory cells. In a subsequent second step, read accesses of each of the second memory cells are carried out. In a subsequent third step, the number of data items generated with the first level at the output terminal during the performance of the read accesses is determined depending on the cell voltage of the second memory cells.

After that, a value which represents one of the first cell voltages and at which a number of first levels of the data item have occurred during the steps of the analysis of the performance of the first sense amplifier is determined. After that, a value which represents one of the second cell voltages and at which the same number of first levels of the data item has occurred during the steps of the analysis of the performance of the second sense amplifier is determined. After that, the difference between the first cell voltage and the second cell voltage is determined. The level of the first precharging voltage or the level of the second precharging voltage is changed by the amount of the difference between the first and the second cell voltages.

The method is used for matching the evaluation performance of the first sense amplifier to the evaluation performance of the second sense amplifier.

In one embodiment of the method of the invention the first sense amplifier is constructed in such a manner that it generates a high voltage potential on the first bit line of the first bit line pair and a low voltage potential on the second bit line of the first bit line pair during a write and read access to one of the first memory cells, and the second sense amplifier is constructed in such a manner that it generates the high voltage potential on the first bit line of the second bit line pair and the low voltage potential on the second bit line of the second bit line pair during a write and read access of one of the second memory cells. The level of the first precharging voltage is increased by the amount of the difference between the first and second cell voltages when the second cell voltage is closer to a mean value between the low and the high voltage potential than the first cell voltage and the level of the first cell voltage is below the level of the second cell voltage. The level of the first precharging voltage is decreased by the amount of the difference between the first and second cell voltages when the second cell voltage is closer to the mean value between the low and the high voltage potential than the first cell voltage and the level of the first cell voltage is above the level of the second cell voltage. The level of the second precharging voltage is increased by the amount of the difference between the first and second cell voltage when the first cell voltage is closer to the mean value between the low and the high voltage potentials than the second cell voltage and the level of the second cell voltage is below the level of the first cell voltage. The level of the second precharging is decreased by the amount of the difference between the first and second cell voltage when the first cell voltage is closer to the mean value between the low and the high voltage potentials than the second cell voltage and the level of the second cell voltage is above the level of the first cell voltage.

According to another embodiment of the method for operating an integrated semiconductor memory device of the invention, the performance of the first sense amplifier is analyzed, and the level of the cell voltage is changed with each new storing of a level of the cell voltage in each of the first memory cells. The performance of the second sense amplifier is analyzed, and the level of the cell voltage is changed with each new storing of a level of the cell voltage in each of the second memory cells.

In a further embodiment in accordance with the invention, the performance of the first sense amplifier is analyzed, and the level of the cell voltage is changed at an interval spacing from the level of the low voltage potential up to the level of the high voltage potential with each new storing of a level of the cell voltage in each of the first memory cells. The performance of the second sense amplifier is analyzed, and the level of the cell voltage is changed at an interval spacing from the level of the low voltage potential to the level of the high voltage potential with each new storing of a level of the cell voltage in each of the second memory cells.

According to still another embodiment of the method for operating an integrated semiconductor memory device of the invention, the first cell voltage is determined at which the number of data items generated with the first level at the output terminal corresponds approximately to the number of half of the existing first memory cells. The second cell voltage is determined at which the number of data items generated with the first level at the output terminal approximately corresponds to the number of half of the existing second memory cells.

The above and still further objects, features and advantages of the present invention will become apparent upon consideration of the following detailed description of specific embodiments thereof, particularly when taken in conjunction with the accompanying drawings in which like numerals designate like components.

DETAILED DESCRIPTION

Figure 4:
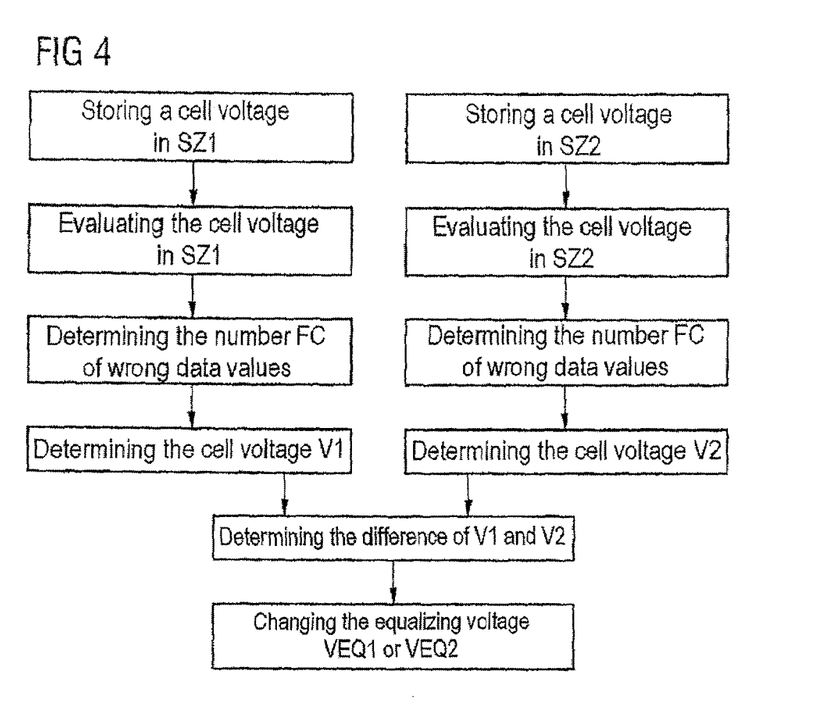
FIG. 4 is a flow chart showing method steps for changing a level of the precharging voltage according to the invention.

A method according to the invention in which differences in the evaluation performance of first and second types of sense amplifiers of a memory cell array are reduced is described below with reference to FIGS. 4 and 5. At the beginning of the method, a cell voltage Vwrite having a low voltage potential VBL=0 volt is stored in all memory cells SZ1 which are evaluated by the first sense amplifiers SA1. After that, the stored cell voltage is evaluated by the connected first sense amplifiers during an evaluation process. At the data terminal DQ, the number of memory cells SZ1, the cell voltage of which has been evaluated with the logical High level by the connected sense amplifier, is determined. Different cell voltages, which are subsequently evaluated, are written into the memory cells SZ1. The higher the stored cell voltage levels, the more memory cells are evaluated with the logical High level instead of with the logical Low level by the first sense amplifiers. After increasing the cell voltage at an interval of 0.1 volts between an output level of the cell voltage of 0 volts and a final level of the cell voltage of 1.2 volts, the evaluation curve for the first sense amplifiers SA1 is determined.

After that, different cell voltage levels between 0 volts and 1.2 volts are also stored in the memory cells SZ2 which are evaluated by the second sense amplifiers SA2. Before the cell voltage levels are increased at intervals of 0.1 volts, the number of memory cells SZ2 which have been evaluated with the logical High level by the second sense amplifiers is determined at the data terminal DQ.

The variation of the evaluation curve for the second sense amplifiers SA2 is similar to the variation of the evaluation curve for the first sense amplifiers SA1. Due to the different construction of the layout of the sense amplifiers, however, the number of memory cells which have been evaluated with the logical High level at a certain level of the cell voltage is different for both types of sense amplifier.

For the first sense amplifiers SA1, a first cell voltage Vwrite 1 is determined at which a certain number FC of memory cells SZ1, preferably half of the memory cells SZ1 to be tested, have been evaluated with the logical High level by the first sense amplifiers. Following this, a second cell voltage Vwrite2 is determined at which the same number FC of memory cells SZ2 have been evaluated with the logical Low level by the second sense amplifiers SA2. After that, a difference between the first cell voltage Vwrite1 and the second cell voltage Vwrite2 is determined. In the example of FIG. 5, this is approximately 200 mvolts. According to the invention, the precharging voltage VEQ on the bit line pairs which are connected to the first sense amplifiers SA1 or to the second sense amplifiers SA2 is altered by the amount of the difference between the cell voltage Vwrite1 and the cell voltage Vwrite2.

Figure 5:
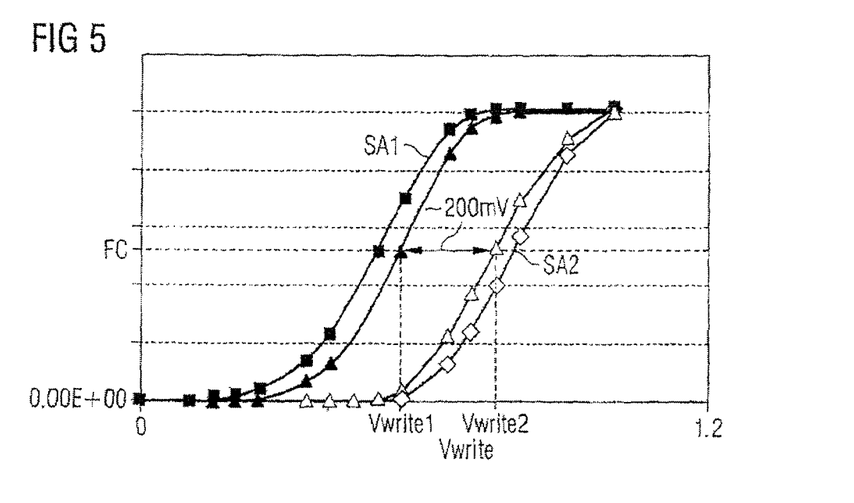
FIG. 5 is a plot showing the determination of a change in potential for the precharging voltage according to the invention.

If the precharging voltage VEQ for the bit lines connected to the first sense amplifiers SA1 is increased by 200 mvolts in the example of FIG. 5, the evaluation curve shown for the first sense amplifiers is displaced in the direction of the evaluation curve for the second sense amplifiers. The evaluation curves of different types of sense amplifier of a memory cell array are preferably displaced in such a manner that the rising variation of the curve lies halfway between the low and high cell voltage level. If, for example, the low cell voltage level is 0 volts and the high cell voltage level is 1.2 volts, the precharging voltage is changed in such a manner that the rising branch of the evaluation curve occupy around approx. 0.6 volts so that the evaluation curve is approximately centered with respect to the low voltage potential VBL and the high voltage potential VBH.

Figure 6:
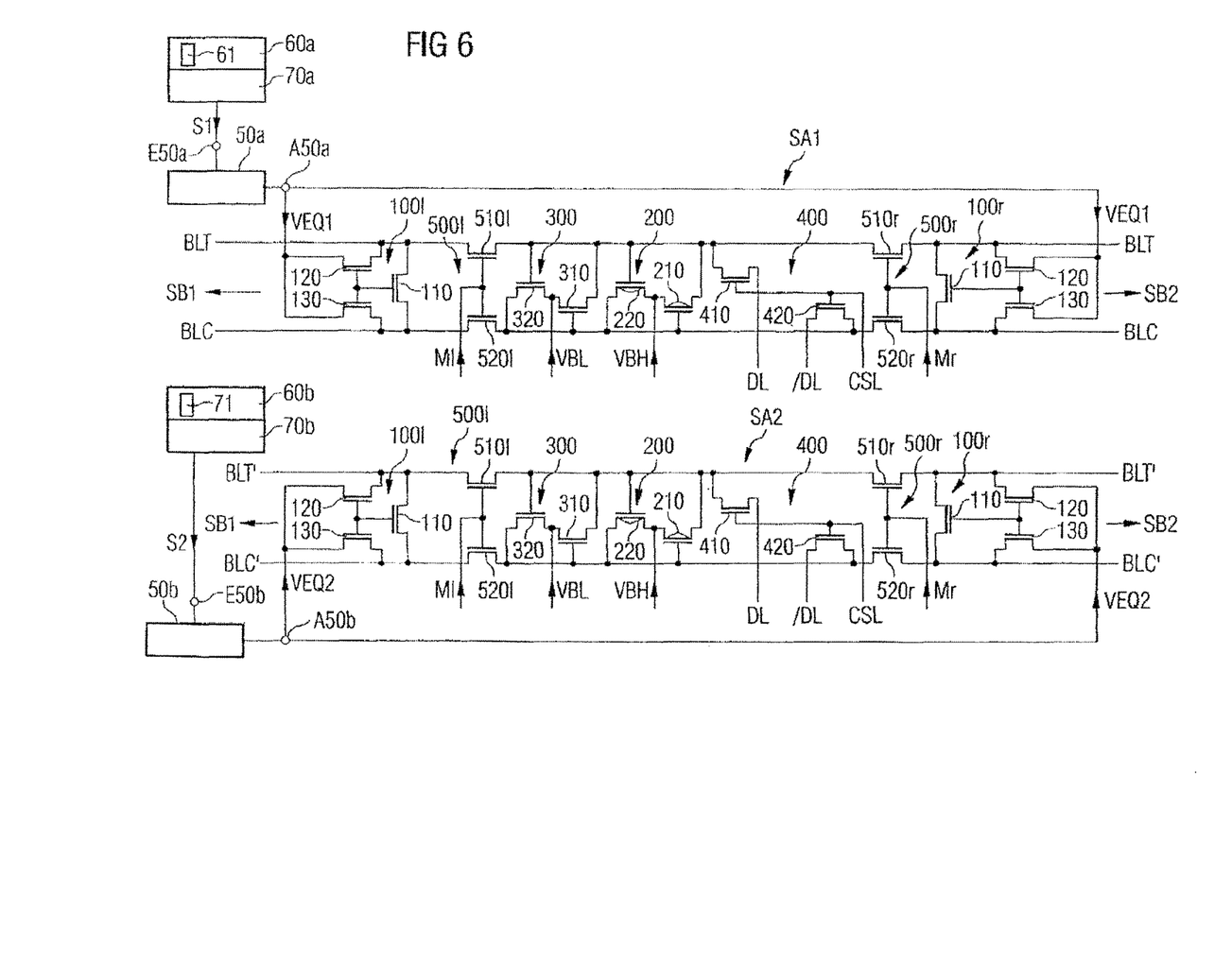
FIG. 6 depicts a first sense amplifier and second sense amplifier with a circuit for changing in the precharging voltage according to the invention.

FIG. 6 shows the circuit configuration of the first sense amplifier SA1 which is connected to the true bit line BLT and the complement bit line BLC (as shown in FIG. 1), and the circuit configuration of the second sense amplifier SA2 which is connected to the true bit line BLT' and the complement bit line BLC'. As can be seen with reference to FIG. 6, the two sense amplifiers have the same circuit configuration. The different performance is caused, for example, by the fact that the bit line lengths of the respective true bit lines BLT and BLT' and the line lengths of the respective complement bit lines BLC and BLC' are different.

The two sense amplifiers in each case include a circuit unit 100*l* and 100*r* which in each case includes the switching transistors 110, 120 and 130. The circuit units 100*l* and 100*r* are used for feeding the precharging voltage onto the connected bit lines. During an access of a memory cell in the memory area SB1, the sense amplifiers are activated by controlling the switching transistors 510*l* and 520*l* of the switching unit 500*l* to conduct. For this purpose, the switching transistors 510*l* and 520*l* are driven at their control terminal with a corresponding level of control signal M1. If, in contrast, a memory cell in the memory area SB2 is to be written to or read out, the switching transistors 510*r* and 520*r* of the switching unit 500*r* are controlled to conduct by being driven with a corresponding level of the control signal Mr. The switching unit 200 which includes the switching transistors 210 and 220 is used for feeding the high voltage potential VBH onto one of the bit lines of the connected bit line pair. The switching unit 300, including the switching transistors 310 and 320, is used for feeding the low voltage potential VBL onto one of the connected bit lines. The switching transistors 410 and 420 of the switching unit 400 are activated by a control signal CSL. As a result, the true bit line BLT or BLT' in each case connected to the sense amplifier is connected to the data line DL and the complement bit line BLC or BLC' in each case connected to the sense amplifiers is connected to the complementary data line DL'.

Since different precharging voltages are fed on the bit lines which are connected to the first sense amplifier SA1 and on the bit lines which are connected to the second sense amplifier SA2, the switching transistors 120 and 130 of the first sense amplifier SA1 are connected to a controllable voltage generator 50*a* for generating the precharging voltage VEQ1 and the switching transistors 120 and 130 of the second sense amplifier SA2 are connected to a controllable voltage generator 50*b* for generating the precharging voltage VEQ2.

When the nominal level of the precharging voltages has been determined in accordance with the method described above, the nominal level of the precharging voltage, which is fed in on the connected bit lines BLT and BLC by the first sense amplifier SA1 is programmed into a memory circuit 60*a*, and, respectively, the nominal level of the precharging voltage which is fed in on the connected bit lines BLT' and BLC' by the second sense amplifier SA2 is programmed into a memory circuit 60*b*. For this purpose, each memory circuit includes a fuse element 61, 71.

A respective evaluator circuit 70*a* and 70*b* reads out the programming state of the fuse elements 61 and 71 and drives an input terminal E50*a* of the first controllable voltage generator 50*a* with a control signal S1 and an input terminal E50*b* of the second controllable voltage generator 50*b* with a control signal S2. The first controllable voltage generator 50*a* generates, depending on the control signal S1, at its output terminal A50*a* the precharging voltage VEQ 1, the level of which corresponds to the nominal level of the precharging voltage stored in the memory circuit 60*a*, and supplies it to the switching units 100*l* and 100*r* of the first sense amplifier SA1. The controllable voltage generator 50*b* generates at its output terminal A50*b*, depending on the control signal S2, the precharging voltage VEQ2, the level of which corresponds to the nominal level of the precharging voltage stored in the memory circuit 60*b* and supplies it to the switching units 100*l* and 100*r* of the second sense amplifier SA2.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Designations
10 Memory cell array
20 Control circuit
30 Address register
50 Controllable voltage generator
60 Memory circuit
70 Evaluating circuit
100 Switching unit for feeding in the precharging voltage
200 Switching unit for feeding in the low voltage potential
300 Switching unit for feeding in the high voltage potential
400 Switching unit for connecting bit lines to data lines
500 Switching unit for connecting a sense amplifier to a bit line pair
AT Selection transistor
BLC Complement bit line
BLP Bit line pair
BLT True bit line
D Data item
DL Data line
DQ Data terminal
FC Number of failed memory cells
RD Read command
SA Sense amplifier
SC Storage capacitor
SB Memory area
SZ Memory cell
TP Contact pad
VBH High voltage potential
VBL Low voltage potential
VEQ Precharging voltage
Vwrite Cell voltage
WL Word line
WR Write command
X, Y Addresses

What is claimed:

1. An integrated semiconductor memory device that adapts evaluation performance of sense amplifiers, the device comprising:
    an output terminal to output a data item;
    a plurality of memory cells, each memory cell being configured to have a cell voltage depending on a memory state;
    a plurality of bit line pairs, each bit line pair comprising a first bit line and a second bit line;
    a plurality of sense amplifiers, each sense amplifier being configured to evaluate the cell voltage of one of the memory cells, wherein:

a first memory cell is connected to a first sense amplifier via one of the bit lines of a first bit line pair, a second memory cell is connected to a second sense amplifier via one of the bit lines of a second bit line pair, the first sense amplifier is configured to evaluate the cell voltage of the first memory cell during a read access of the first memory cell, the data item at the output terminal is generated at a first level when the cell voltage of the first memory cell is evaluated by the first sense amplifier to be above a first threshold voltage, and the data item is generated at a second level at the output terminal when the cell voltage of the first memory cell is evaluated by the first sense amplifier to be below the first threshold voltage; and a second sense amplifier is configured to evaluate the cell voltage of a second memory cell during a read access of the second memory cell, the data item is generated at the first level at the output terminal when the cell voltage of the second memory cell is evaluated by the second sense amplifier to be above a second threshold voltage, and the data item is generated at the second level at the output terminal when the level of the cell voltage of the second memory cell is evaluated by the second sense amplifier to be below the second threshold voltage, the level of the second threshold voltage differing from the level of the first threshold voltage;

a first controllable voltage generator to generate a first precharging voltage; and a second controllable voltage generator to generate a second precharging voltage, wherein a level of the first precharging voltage differs from a level of the second precharging voltage;

wherein the first precharging voltage is supplied to the bit lines of the first bit line pair, and the second precharging voltage is supplied to the bit lines of the second bit line pair.

2. The integrated semiconductor memory device of claim 1, wherein:

the first sense amplifier is configured to generate a high voltage potential on the one of the bit lines of the first bit line pair and a low voltage potential on the other of the bit lines of the first bit line pair during a write and read access of the first memory cell;

the second sense amplifier is configured to generate the high voltage potential on the one of the bit lines of the second bit line pair and the low voltage potential on the other of the bit lines of the second bit line pair during a write and read access of the second memory cell;

the first controllable voltage generator is configured to generate the first precharging voltage at a level that is between the high voltage potential and the low voltage potential; and the second controllable voltage generator is configured to generate the second precharging voltage at a level that is between the high voltage potential and the low voltage potential.

3. The integrated semiconductor memory device of claim 1, further comprising:

a first memory circuit to store a nominal level of the first precharging voltage; and a second memory circuit to store a nominal level of the second precharging voltage;

wherein the first controllable voltage generator is configured to generate the first precharging voltage at a level that corresponds with the nominal level stored in the first memory circuit, and the second controllable voltage generator is configured to generate the second precharging voltage at a level that corresponds with the nominal level stored in the second memory circuit.

4. The integrated semiconductor memory device of claim 3, further comprising:

a first evaluating circuit to generate a first control signal; and a second evaluating circuit to generate a second control signal;

wherein the first control signal is supplied to the first controllable voltage generator, the second control signal is supplied to the second controllable voltage generator, the first evaluating circuit is configured to generate a level of the first control signal depending upon the nominal level of the first precharging voltage stored in the first memory circuit, the second evaluating circuit is configured to generate a level of the second control signal depending upon the nominal level of the second precharging voltage stored in the second memory circuit, the first controllable voltage generator is configured to generate the level of the first precharging voltage depending upon the level of the first control signal, and the second controllable voltage generator is configured to generate the level of the second precharging voltage depending upon the level of the second control signal.

5. The integrated semiconductor memory device of claim 3, wherein each of the first and second memory circuits includes fuse elements.

6. A method for operating an integrated semiconductor memory device for adapting the evaluation performance of sense amplifiers, comprising:

providing an integrated semiconductor memory device comprising a first sense amplifier and a second sense amplifier, the first sense amplifier being connected to a first bit line pair including a first bit line and a second bit line and a first set of memory cells being connected to the first bit line or the second bit line of the first bit line pair, the second sense amplifier being connected to a second bit line pair including a first bit line and a second bit line and a second set of memory cells being connected to the first bit line or the second bit line of the second bit line pair, wherein a memory state including a cell voltage is storable in each memory cell;

charging the bit lines of the first bit line pair to a first precharging voltage and charging the bit lines of the second bit line pair to a second precharging voltage during a precharging process;

evaluating the cell voltage of a first memory cell with the first sense amplifier during a read access of the first memory cell, wherein a data item is generated at a first level on an output terminal when the cell voltage of the first memory cell is evaluated by the first sense amplifier to be above a first threshold voltage, and the data item is generated with a second level at the output terminal when the cell voltage of the first memory cell is evaluated by the first sense amplifier to be below the first threshold voltage;

evaluating the cell voltage of the second memory cell with the second sense amplifier during a read access of the second memory cell, wherein the data item is generated at the first level on the output terminal when the cell voltage of the second memory cell is evaluated by the second sense amplifier to be above a second threshold voltage, and the data item is generated at the second level on the output terminal when the level of the cell voltage of the second memory cell is evaluated by the second sense amplifier to be below the second threshold voltage, the level of the second threshold voltage differing from the level of the first threshold voltage;

analyzing a performance of the first sense amplifier by repeating the following steps (a1) to (c1):
  (a1) storing a level of the cell voltage in each memory cell of the first set;
  (b1) performing read accesses of each memory cell of the first set; and
  (c1) determining a number of data items on the output terminal generated at the first level depending upon the level of the cell voltage of the first memory cell;

analyzing a performance of the second sense amplifier by repeating the following steps (a2) to (c2):
  (a2) storing a level of the cell voltage in each memory cell of the second set;
  (b2) performing read accesses of each memory cell of the second set; and
  (c2) determining a number of data items generated at the first level on the output terminal depending upon the level of the cell voltage of the second memory cell;

determining a first cell voltage that represents one of the cell voltages at which a number of first levels of the data item have occurred during the steps (a1) to (c1);

determining a second cell voltage that represents one of the cell voltages at which the number of first levels of the data item has occurred during the steps of (a2) to (c2);

determining a difference between the first cell voltage and the second cell voltage;

changing the level of the first precharging voltage or the level of the second precharging voltage by the amount of the difference between the first cell voltage and the second cell voltage.

7. The method of claim 6, wherein the first sense amplifier generates a high voltage potential on the first bit line of the first bit line pair and a low voltage potential on the second bit line of the first bit line pair during a write and read access of the first memory cell, and the second sense amplifier generates the high voltage potential on the first bit line of the second bit line pair and the low voltage potential on the second bit line of the second bit line pair during a write and read access of the second memory cell, and the method further comprises:

increasing the level of the first precharging voltage by the amount of the difference between the first cell voltage and the second cell voltage when the second cell voltage is closer to a mean value between the low voltage potential and the high voltage potential than the first cell voltage and the level of the first cell voltage is below the level of the second cell voltage;

decreasing the level of the first precharging voltage by the amount of the difference between the first cell voltage and the second cell voltage when the second cell voltage is closer to the mean value between the low voltage potential and the high voltage potential than the first cell voltage and the level of the first cell voltage is above the level of the second cell voltage;

increasing the level of the second precharging voltage by the amount of the difference between the first cell voltage and the second cell voltage when the first cell voltage is closer to the mean value between the low voltage potential and the high voltage potential than the second cell voltage and the level of the second cell voltage is below the level of the first cell voltage; and decreasing the level of the second precharging voltage by the amount of the difference between the first cell voltage and the second cell voltage when the first cell voltage is closer to the mean value between the low voltage potential and the high voltage potential than the second cell voltage and the level of the second cell voltage is above the level of the first cell voltage.

8. The method of claim 6, wherein:
during the analyzing of the performance of the first sense amplifier, the cell voltage is changed with each new storing of a level of the cell voltage in each memory cell of the first set in step (a1); and
during the analyzing of the performance of the second sense amplifier, the cell voltage is changed with each new storing of a level of the cell voltage in each memory cell of the second set in step (a2).

9. The method of claim 8, wherein:
during the analyzing of the performance of the first sense amplifier, the cell voltage is changed at a selected interval spacing from the level of the low voltage potential up to the level of the high voltage potential with each new storing of a level of the cell voltage in each memory cell of the first set in step (a1); and
during the analyzing of the performance of the second sense amplifier, the cell voltage is changed at a selected interval spacing from the level of the low voltage potential up to the level of the high voltage potential with each new storing of a level of the cell voltage in each memory cell of the second set in step (a2).

10. The method of claim 6, wherein:
the first cell voltage is determined when the number of data items generated with the first level is at least as great as half the number of memory cells in the first set; and
the second cell voltage is determined when the number of data items generated with the first level is at least as great as half the number of memory cells in the second set.

11. The method of claim 6, wherein the integrated semiconductor device further includes a contact pad, and the method further comprises:
applying a voltage potential to the contact pad to store the level of the cell voltage in each of the memory cells of the first and second sets.

12. The method of claim 6, wherein the semiconductor memory device further includes a first memory circuit to store a nominal level of the first precharging voltage, a first evaluating circuit to evaluate a memory state of the first memory circuit, a first controllable voltage generator to generate the first precharging voltage, a second memory circuit to store a nominal level of the second precharging voltage, a second evaluating circuit to evaluate a memory state of the second memory circuit, and a second controllable voltage generator to generate the second precharging voltage, the method further comprising:
programming the nominal level of the first precharging voltage into the first memory circuit;
programming the nominal level of the second precharging voltage into the second memory circuit;
evaluating the memory state of the first memory circuit with the first evaluating circuit;
evaluating the memory state of the second memory circuit with the second evaluating circuit;
driving the first controllable voltage generator of the first evaluating circuit with a first control signal to facilitate generating the nominal level of the first precharging voltage; and driving the second controllable voltage generator by the second evaluating circuit with a second control signal to facilitate generating the nominal level of the second precharging voltage.

13. The method of claim 12, wherein each of the first and second memory circuits comprises a fuse element to facilitate programming of a memory state into each of the first and second memory circuits in order to specify the nominal levels of the first and second precharging voltages.

* * * * *